United States Patent
Fifield et al.

(10) Patent No.: US 7,057,180 B2
(45) Date of Patent: Jun. 6, 2006

(54) DETECTOR FOR ALPHA PARTICLE OR COSMIC RAY

(75) Inventors: John A. Fifield, Underhill, VT (US); Paul D. Kartschoke, Williston, VT (US); William A. Klaasen, Underhill, VT (US); Stephen V. Kosonocky, Wilton, CT (US); Randy W. Mann, Poughquag, NY (US); Jeffery H. Oppold, Richmond, VT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 10/604,416

(22) Filed: Jul. 18, 2003

(65) Prior Publication Data

US 2005/0012045 A1 Jan. 20, 2005

(51) Int. Cl.
*G01T 1/24* (2006.01)
(52) U.S. Cl. ............................. 250/370.02
(58) Field of Classification Search ........... 250/370.02
See application file for complete search history.

(56) References Cited

U.S. PATENT DOCUMENTS

| | | | |
|---|---|---|---|
| 3,767,915 A | 10/1973 | Battist | |
| 4,788,432 A | 11/1988 | Patel | |
| 6,104,211 A * | 8/2000 | Alfke .......................... | 326/91 |
| 6,204,516 B1 | 3/2001 | Shabde et al. | |
| 6,211,692 B1 | 4/2001 | Shabde et al. | |
| 6,271,568 B1 * | 8/2001 | Woodruff et al. ............ | 257/379 |
| 6,583,470 B1 * | 6/2003 | Maki et al. .................. | 257/349 |
| 6,665,161 B1 * | 12/2003 | Brady et al. .................. | 361/78 |
| 6,828,561 B1 * | 12/2004 | Layman et al. ......... | 250/370.02 |
| 6,829,176 B1 * | 12/2004 | Callaway et al. ....... | 365/189.01 |
| 6,909,159 B1 * | 6/2005 | Friend et al. ................ | 257/428 |
| 2003/0131307 A1 * | 7/2003 | Taylor et al. ................ | 714/763 |

(Continued)

FOREIGN PATENT DOCUMENTS

JP 59-9844 1/1984

*Primary Examiner*—Albert Gagliardi
(74) *Attorney, Agent, or Firm*—Scully, Scott, Murphy & Presser, P.C.; Michael J. LeStrange, Esq.

(57) ABSTRACT

A detector circuit and method for detecting a silicon well voltage or current to indicate an alpha particle or cosmic ray strike of the silicon well. One significant application for the detection circuit of the present invention is for the redundancy repair latches that are used in SRAMs. The redundancy repair latches are normally written once at power-up to record failed latch data and are not normally written again. If one of the latches changes states due to an SER (Soft Error Rate-such as a strike by an alpha particle or cosmic ray) event, the repair data in the redundancy latches of the SRAM would now be incorrectly mapped. The detector circuit and method monitors the latches for the occurrence of an SER event, and responsive thereto issues a reload of the repair data to the redundancy repair latches. A first embodiment of the detector circuit differentially detects the floating voltages of first and second silicon wells during periods of non-operation of the circuits fabricated in the first and second silicon wells. In a second embodiment, a detector circuit monitors the background voltage level of a single silicon well over first and second consecutive periods of time. A second application for the detection circuit is for traditional logic circuits.

24 Claims, 2 Drawing Sheets

U.S. PATENT DOCUMENTS

2004/0124876 A1* 7/2004 Plants .................. 326/39
2004/0148069 A1* 7/2004 Marshall et al. .......... 701/13
2005/0001171 A1* 1/2005 Cottrell et al. ......... 250/370.14
2005/0127971 A1* 6/2005 Hoff .................. 327/217

* cited by examiner

US 7,057,180 B2

DETECTOR FOR ALPHA PARTICLE OR COSMIC RAY

BACKGROUND OF INVENTION

The present invention relates generally to a detector circuit and method for sensing an SER (Soft Error Rate) event, such as a strike by an alpha particle or cosmic ray in a silicon substrate, and more particularly pertains to such a detector circuit and method for detecting the floating voltage of a silicon well during a period of non-operation of the circuits fabricated in the silicon well.

SUMMARY OF INVENTION

Accordingly, it is a primary object of the preset invention to provide a detector circuit and method for sensing an SER event such as an alpha particle or cosmic ray strike in a silicon substrate.

One significant application for the detection circuit of the present invention is for the redundancy repair latches that are used in SRAMs. The redundancy repair latches are normally written once at power-up to record failed latch data and are not normally written again. If one of the latches changes states due to an SER (Soft Error Rate-such as a strike by an alpha particle or cosmic ray) event, the repair data in the redundancy latches of the SRAM would now be incorrectly mapped. The detector circuit and method monitors the latches for the occurrence of an SER event, and responsive thereto issues a reload of the repair data to the redundancy repair latches. A first embodiment of the detector circuit differentially detects the floating voltages of first and second silicon wells during periods of non-operation of the circuits fabricated in the first and second silicon wells. In a second embodiment, a detector circuit monitors the background voltage level of a single silicon well over first and second consecutive periods of time.

A second application for the detection circuit of the present invention is for the detection of an SER event within traditional logic circuits. A traditional clock that controls CMOS circuitry can define when the logic is active (i.e. clock high) versus inactive (i.e. clock low). During the time period when the clock is low, the present invention can be used to detect SER events.

BRIEF DESCRIPTION OF DRAWINGS

The foregoing objects and advantages of the present invention for a detector circuit and method for sensing an alpha particle or cosmic ray strike circuit may be more readily understood by one skilled in the art with reference being had to the following detailed description of several embodiments thereof, taken in conjunction with the accompanying drawings wherein lime elements are designated by identical reference numerals throughout the several views, and in which.

DETAILED DESCRIPTION

After a charged particle, such as an alpha particle or a cosmic ray, passes through silicon, a small but perceptible current flows in the silicon. The present invention provides detector circuits and methods for sensing an alpha particle or cosmic ray strike in a silicon substrate having semiconductor circuits fabricated therein.

An amplifying detector circuit is connected to the silicon substrate to provide a detectable digital signal when the silicon substrate receives a charged particle strike. A clock signal for clocking and operating the semiconductor circuits fabricated in the silicon substrate serves to specify periods of active and inactive operation of the semiconductor circuits, and the detector is active only when the clock signal is inactive to eliminate false triggering from normal device substrate current flowing during normal switching operations of the semiconductor circuits.

The present invention provides a detector circuit coupled to a silicon well for detecting a silicon well voltage or current to indicate an alpha particle or cosmic ray strike of the silicon well.

A P well is typically tied high (Vdd) until its off-cycle when it will start drifting down and then if it gets hit by an SER event, the voltage will go slightly lower than a P well that was not hit. An N well is typically tied low (ground) until its off cycle when it will start drifting high and then if it gets hit by an SER event, the voltage in the N well will go slightly higher. The present invention can be used for detecting SER events in both P wells and N wells.

One significant application for the detection circuit of the present invention is for the redundancy repair latches that are used in SRAMs such as ASIC SRAMs. The redundancy repair latches are normally written once at power-up to record failed latch data and then are never written again. If one of the latches changes states due to an SER (Soft Error Rate-such as a strike by an alpha particle or cosmic ray) event, the repair data in the redundancy latches of the SRAM would now be incorrectly mapped, and thus the SRAM would fail during normal operation. Using the techniques described herein, the present invention monitors the SER activity of the latches and detects the occurrence of an SER event. The system architecture monitors the output of the SER event detector circuit, and once an SER event is flagged, the system can issue a reload of the repair data to the redundancy repair latches.

A second application for the detection circuit of the present invention is for the detection of an SER event within traditional logic circuits. A traditional clock that controls CMOS circuitry can define when the logic is active (i.e. clock high) versus inactive (i.e. clock low). During the time period when the clock is low, the present invention can be used to detect SER events.

Figure 1:
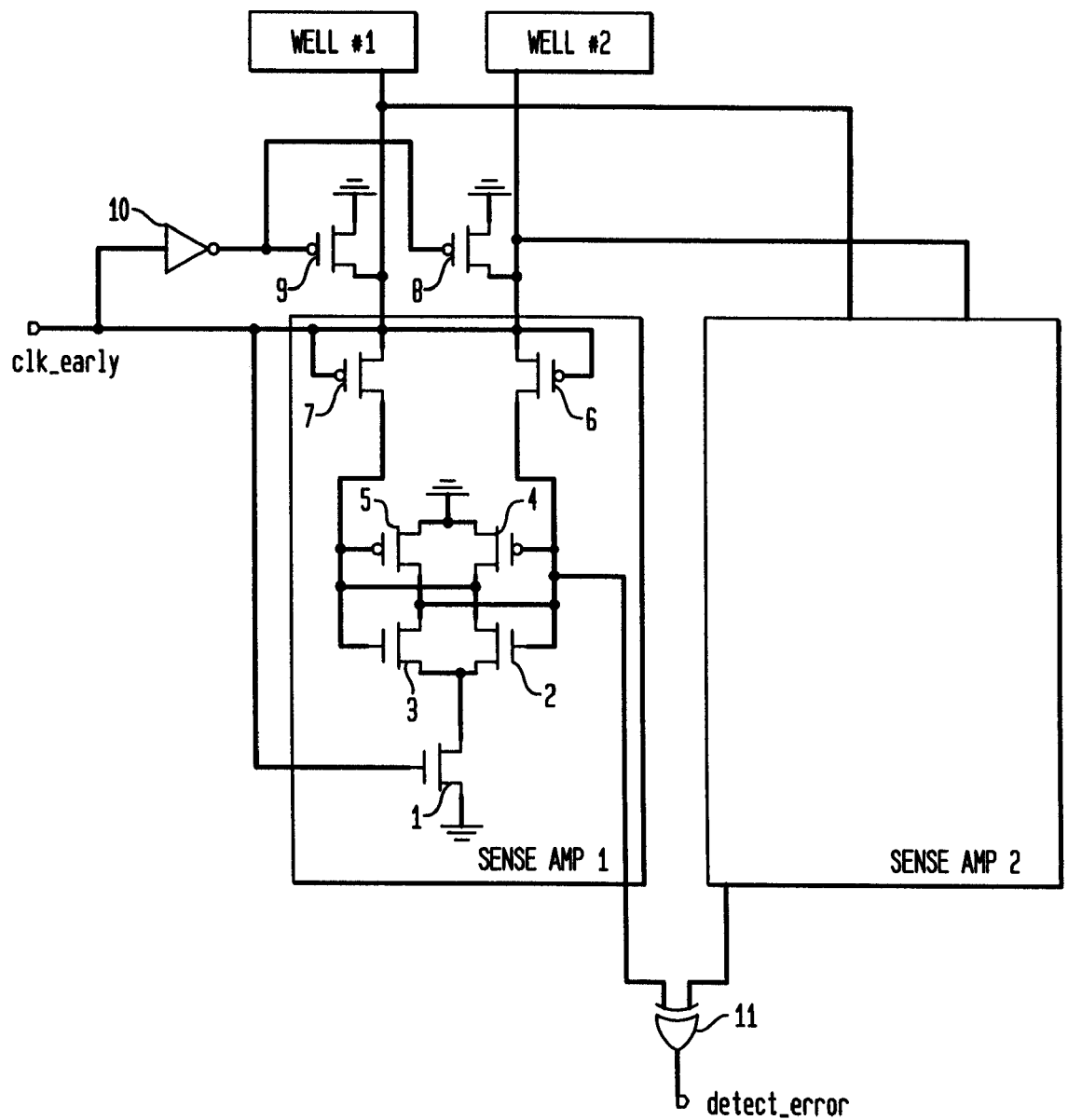
FIG. 1 illustrates a first embodiment of a detector circuit pursuant to the present invention for detecting an SER event (alpha particle or cosmic ray strike) of a first silicon well or a second silicon well, by differentially detecting the floating voltages of the first and second silicon wells during periods of non-operation of the circuits fabricated in the first and second silicon wells.

FIG. 1 illustrates a first embodiment of a detector circuit pursuant to the present invention for detecting an SER event (alpha particle or cosmic ray strike) of a first silicon P well 1 or a second silicon P well 2, by differentially detecting the floating voltages of the first and second silicon wells during periods of non-operation of the circuits fabricated in the first and second silicon wells. Each of the silicon P wells 1 and 2 is connected to two Sense Amps (SA) 1 and 2 which are substantially identical, with FIG. 1 only illustrating the circuit details of Sense Amp 1. A single Sense Amp is able to detect that one of the two wells 1 and 2 incurred an SER event, but would not be able to detect which one of the two wells 1 and 2 incurred the SER event. Two Sense Amps 1 and 2 are provided to be able to detect which one of the two wells 1 and 2 incurred the SER event, as explained below.

The silicon wells 1 and 2 are connected to their bias power supplies through respective feeder devices 9, 8 which are turned on during normal operation of the circuits defined in the silicon wells 1 and 2. Before a period of normal operation of the circuits, the rising edge of a clk_early signal turns on the Sense Amps 1 and 2 to capture the floating voltages of the wells 1 and 2 in latches defined in the Sense Amps 1 and 2.

A control logic circuit generates the following control signals:

1. Feeder Device Pulse-ON is a pulse which is used to charge the silicon wells 1 and 2 to a full bias potential Vdd by turning on the feeder devices 9, 8. The pulse width of Feeder Device Pulse-On is determined by the time required to charge the silicon wells 1 and 2 to the full bias potential Vdd;
2. Feeder Device Pulse-OFF is the period after Feeder Device Pulse-ON, during which the feeder devices 9, 8 are turned off and during which the circuits fabricated in the silicon wells 1 and 2 are inactive, and the voltages of the silicon wells 1 and 2 are floating;
3. A series of clk_early pulses are generated just prior to the start of normal operation of the circuits fabricated in the silicon wells 1 and 2 to drive the detection circuit of FIG. 1 to monitor the floating voltages of the silicon wells 1 and 2 for the occurrence of an SER event during the previous inactive floating period. The frequency of the clk_early pulses is determined by the charge rate of the SER event. A simulation has indicated a frequency of about 2 ns, which results in a 50 mV voltage differential for a 500 um$^2$ well area.

The duty cycle of the number of Feeder Device Pulse-ON pulses to the number of clk_early pulses is determined by the leakage rate of the wells. It is important to maximize the time spent sensing versus the time the feeder devices are on.

To monitor for the occurrence of an SER event, the rising edge of a clk_early pulse on the clock line turns off the devices 7 and 6 to capture the floating voltages of the silicon wells 1 and 2 in latches defined in each of the Sense Amps 1 and 2 at that point in time. Prior thereto, the floating voltages of silicon wells 1 and 2, which had initially been charged to the full bias potential Vdd during the Feeder Device Pulse-ON, would generally drift downward with time, with the floating voltages of wells 1 and 2 being approximately equal, unless one of the wells incurred an SER event, in which case its floating voltage would be slightly higher. The clk_early pulse turns on the differential sensing and latch circuit within each Sense Amp, which comprises NFET devices 1, 2 and 3 and PFET devices 4 and 5, which amplifies and rectifies any voltage differential between the captured floating voltages of the silicon wells 1 and 2, with the outputs of the two Sense Amps 1 and 2 being input to an XOR gate 11.

The Sense Amps 1 and 2 can be designed with a built in asymmetry, to establish a preferential set for the latches in SA1 and SA2. The asymmetry can be achieved with off-set geometries between the device sizes in SA1 and SA2. Alternatively a latch could be designed with a preferential set by coupling resistor voltage dividers to each of the two inputs to SA1 and SA2 which would develop unequal voltages at the latch inputs. In this way, the voltages of the two silicon wells 1 and 2, which were initially biased at Vdd, would drop to some voltage over the floating time period, for example to approximately 0.50 Vdd and 0.55 Vdd at the latch inputs.

The following truth table is for the outputs of SA1 and SA2

| Truth Table | | |
|---|---|---|
| SA1 | SA2 | Result |
| 0 | 0 | OK |
| 0 | 1 | Well #1 error |
| 1 | 0 | Well #2 error |
| 1 | 1 | N/A |

Assume that the Sense Amps have the built in asymmetry described above, such that with no SER event, the sampled floating voltages at the latch inputs would be 0.50 Vdd and 0.55 Vdd. Sense Amp 1 would produce a 0 output, and Sense Amp 2 would normally produce a 1 output, but the asymmetry would cause Sense Amp 2 to invert its output to produce a 0 output instead. Stated differently, for equal input floating voltages from the wells 1 and 2, the asymmetry results in the 0 0 condition specified in line 1 of the Truth Table, such that the XOR 11 would not produce a 1 detect_error output, the presence of which indicates an SER event. If well 1 incurred an SER event, resulting in a slightly higher floating voltage in well 1 than in well 2, then the Sense Amps 1 and 2 would produce the outputs of line 2 of the Truth Table, resulting in a 1 output from XOR 11, indicating an SER event, with the SA1 output 0 and the SA2 output 1 indicating an SER event in well 1. Similarly, if well 2 incurred an SER event, resulting in a slightly higher floating voltage in well 2 than in well 1, then the Sense Amps 1 and 2 would produce the outputs of line 3 of the Truth Table, resulting in a 1 output from XOR 11, with the SA1 output 1 and the SA2 output 0 indicating an SER event in well 2. The fourth line of the Truth Table is listed but has no realistic meaning whatsoever.

For the embodiment of FIG. 1 for use with an SRAM, the clk_early signal on the clock line would be produced just prior to normal operation of the SRAM, and a 1 output from XOR 11, combined with logic for detecting the conditions of lines 1 and 2 of the Truth Table, would cause the system to issue a reload of the repair data into the redundancy latches of the circuits of well 1 or the circuits of well 2.

Figure 2:
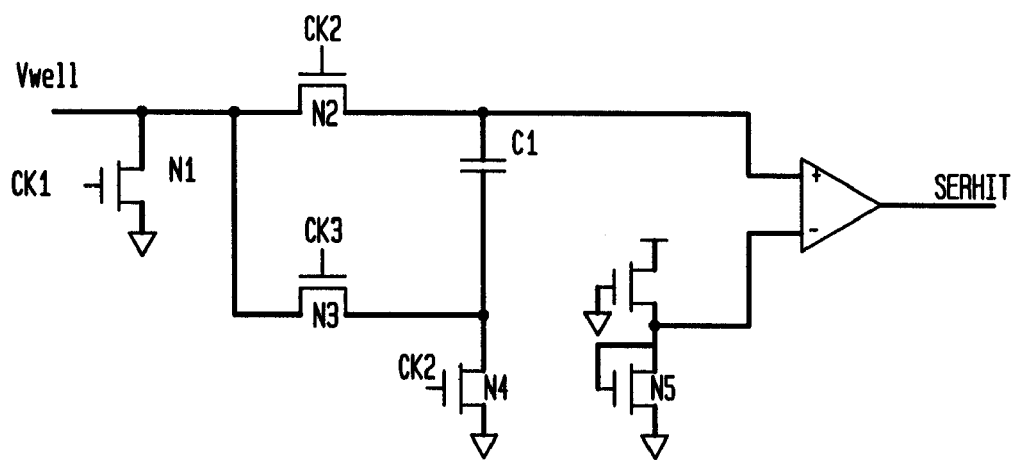
FIG. 2 illustrates a second embodiment of the present invention in which a detector circuit monitors a single silicon well in a silicon substrate for an SER event, wherein the silicon well voltage Vwell during a first sampling period of time is compared with the silicon well voltage Vwell over a second sampling period of time to detect a deviation in the silicon well voltage which is indicative of an SER event.

FIG. 2 illustrates a second embodiment of the present invention in which a detector circuit monitors a single silicon well in a silicon substrate for an SER event by monitoring the background voltage level of the single silicon well over a period of time. In this embodiment, the silicon well voltage Vwell during a first sampling period of time is compared with the silicon well voltage Vwell over a second sampling period of time to detect a deviation in the silicon well voltage which is indicative of an SER event. The circuit of FIG. 2 is a capacitive sensing detector circuit which takes a correlated double sampling of the background voltage level of the Vwell node voltage to allow offset cancellation of base leakage current and noise current injection of the Vwell node.

Figure 3:
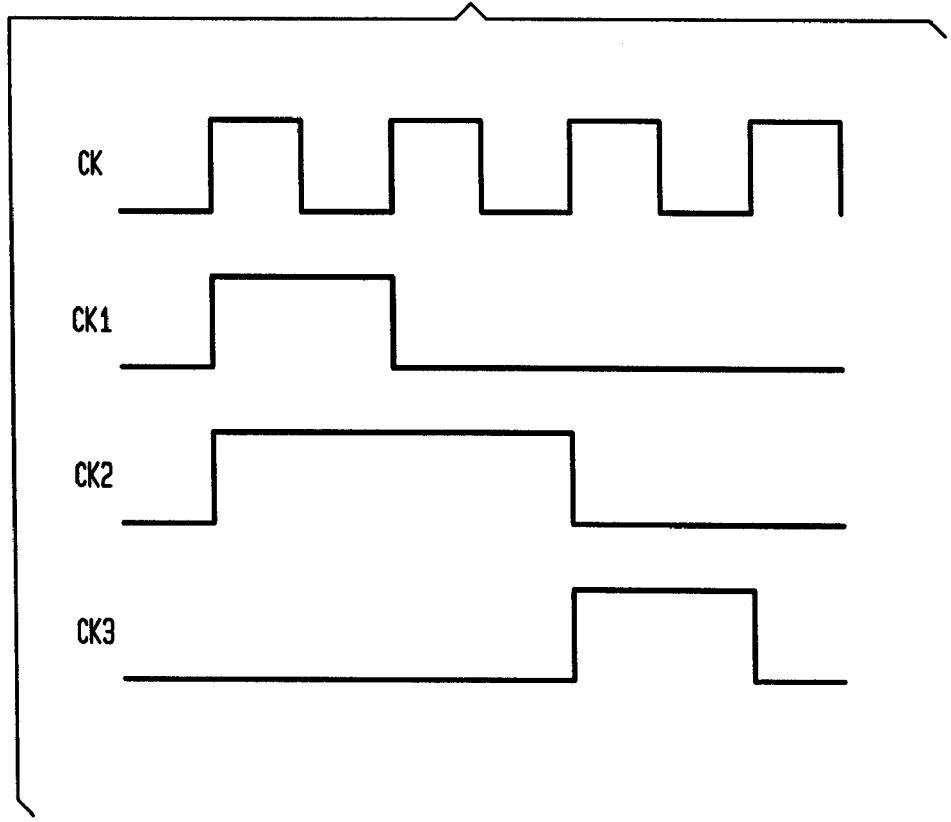
FIG. 3 illustrates timing diagrams for the clock control signals for the circuit of FIG. 2.

FIG. 3 illustrates timing diagrams for the clock control signals for the circuit of FIG. 2. In the circuit of FIG. 2 the sampled well node voltage Vwell is input to a first device N1 coupled between Vwell and ground and controlled by a first clock signal CK1. The sampled well node voltage Vwell is also coupled through a second device N2, controlled by a second clock CK2, to the positive input of a differential amplifier. The connection between the second device N2 and the differential amplifier is coupled through a capacitor C1 and a fourth device N4, controlled by the second clock CK2, to ground. A third device N3, controlled by a third clock CK3, is coupled in parallel to the second device N2 and the capacitor C1, between the sampled well node voltage Vwell and the connection between the capacitor C1 and the fourth device N4. A reference circuit is comprised of series connected voltage divider devices N5 and N6, and a voltage divider output therebetween is applied to the negative input of the differential amplifier.

As illustrated by the circuit of FIG. 2 and the timing diagrams of FIG. 3, the operation of the circuit is as follows. During a first phase 1, the clocks CK, CK1 and CK2 go high and devices N1, N2 and N4 are turned on, which resets the Vwell node to ground and discharges the capacitor C1 to ground. During a second phase 2, when clock CK1 goes low and clock CK2 remains high, the capacitor C1 charges to the potential of the Vwell node, sensing the background voltage level. During a third phase 3, when clock CK2 goes low and clock CK3 goes high, the voltage across the capacitor C1 is reversed, and the voltage charged during the second clock phase 2 is subtracted from the voltage seen on the Vwell node during the third clock phase (C1=L, C2=L, C3=H).

If an SER hit is observed in the Vwell node, the injected charge will raise the voltage beyond the background voltage stored on capacitor C1 during the second phase 2, and if it exceeds a threshold voltage provided by the reference circuit of NFET device N5, N6, the comparator will go high to indicate an SER hit.

While several embodiments and variation of the present invention for a detector circuit and method are described in detail herein, it should be apparent that the disclosure and teachings of the present invention will suggest many alternative designs to those skilled in the art.

The invention claimed is:

1. A detector cicuit for detecting an alpha particle or cosmic ray strike in a silicon substrate having semiconductor circuits fabricated therein comprising:
    a detector circuit connected to the silicon substrate to provide a detectable digital signal when the silicon substrate receives an alpha particle or cosmic ray strike;
    means for generating a timing signal specifying periods of non-active operation of the semiconductor circuits, wherein the detector circuit is activated by the timing signal only when the semiconductor circuits are non-active to eliminate false triggering from substrate currents flowing during normal switching operations of the semiconductor circiuts.

2. The detector circuit of claim 1, wherein the timing signal is generated from a clock signal for clocking and operating the semiconductor circuits fabricated in the silicon substrate.

3. The detector circuit of claim 1, coupled to activate redundancy repair latches in a SRAM, wherein when the detector circuit detects an alpha particle or cosmic ray strike of the redundancy repair latches, a reload is issued of the repair data to the redundancy repair latches.

4. A detector circuit for detecting an alpha particle or cosmic ray strike of a first silicon well or a second silicon well, by differentially detecting floating voltages of the first and second silicon wells during periods of non-operation of circuits fabricated in the first and second silicon wells, comprising:
    a sense amp, including a latch circuit therein, connected to each of the first and second wells;
    means for generating an early timing signal before a period of normal operation of the circuits defined in the first and second silicon wells, wherein the early timing signal turns on the sense amp and disconnects the sense amp from the first and second silicon wells, to capture the floating voltages of the first and second silicon wells in the sense amp at that point in time, and a differential sensing circuit within the sense amp amplifies and rectifies any voltage differential between the captured floating voltages of the first and second silicon wells.

5. The detector circuit of claim 4, coupled to activate redundancy repair latches in a SRAM, wherein when the detector circuit detects an alpha particle or cosmic ray strike of the redundancy repair latches, a reload is issued of the repair data to the redundancy repair latches.

6. A detector circuit for detecting an alpha particle or cosmic ray strike of a first silicon well or a second well, by differentially detecting floating voltages of the first and second silicon wells during periods of non-operation of circuits fabricated in the first and second silicon wells, comprising:
    first and second sense amps, each including a latch circuit therein, connected to each of the first and second silicon wells;
    means for generating an early timing signal before a period of normal operation of the circuits defined in the first and second silicon wells, wherein the early timing signal turns on the first and second sense amps and disconnects the first and second sense amps from the first and second silicon wells to capture the floating voltages of the first and second silicon wells in each of the first and second sense amps at that point in time, and a differential sensing circuit within each sense amp amplifies and rectifies any voltage differential between the captured floating voltages of the first and second silicon wells.

7. The detector circuit of claim 6, wherein the first and second sense amps have a built in asymmetry, to establish a preferential set of the latches in the first and second sense amps, such that for equal input floating voltages from the first and second wells, the asymmetry results in a first specified output condition, and if the first well incurred a strike, resulting in a slightly higher floating voltage in the first well than in the second well, then the first and second sense amps produce a second specified output condition indicating a strike in the first well, and if the second well incurred a strike, resulting in a slightly higher floating voltage in the second well than in the first well, then the first and second sense amps produce a third specified output condition indicating a strike in the second well.

8. The detector circuit of claim 6, coupled to activate redundancy repair latches in a SRAM, wherein when the detector circuit detects an alpha particle or cosmic ray strike of the redundancy repair latches, a reload is issued of the repair data to the redundancy repair latches.

9. A detector circuit for monitoring a single silicon well in a silicon substrate for an alpha particle or cosmic ray strike by monitoring a background voltage level of the silicon well over consecutive periods of time, wherein the silicon well voltage Vwell over a first sampling period of time is compared with the silicon well voltage Vwell over a second sampling period of time to detect a deviation in the silicon well voltage which is indicative of a strike, to take a correlated double sampling of the background voltage level of the Vwell node voltage while allowing cancellation of base leakage current and noise current injection of the silicon well voltage Vwell.

10. The detector circuit of claim 9, wherein:
the sampled well node voltage Vwell is input to a first device coupled between Vwell and ground and controlled by a first clock signal CK1;
the sampled well node voltage Vwell is also coupled through a second device, controlled by a second clock CK2, to a positive input of a differential amplifier;
the connection between the second device and the differential amplifier is coupled through a capacitor and a fourth device, conftrolled by the second clock CK2, to ground;
a third device, controlled by a third clock CK3, is coupled in parallel to the second device and the capacitor, between the sampled well node voltage Vwell and the connection between the capacitor and the fourth device;
a reference circuit for producing a reference voltage is applied to a negative input of the differential amplifier.

11. The detector circuit of claim 10, wherein the reference voltage is produced by a reference circuit comprised of series connected voltage divider fifth and sixth devices, with a voltage divider output therebetween which produces the reference voltage.

12. The detector circuit of claim 10, wherein:
during a first clock phase, the clocks CK, CK1 and CK2 go high and the first, second and fourth devices are turned on, which resets the Vwell node to ground and discharges the capacitor to ground;
during a second clock phase, the clock CK1 goes low and the clock CK2 remains high, and the capacitor charges to the potential of the Vwell node, sensing a background voltage level of the silicon well;
during a third clock phase, the clock CK2 goes low and the clock CK3 goes high, the voltage across the capacitor is reversed, and the voltage charged during the second clock phase is subtracted from the voltage seen on the Vwell node during the third clock phase, and if a strike is observed in the Vwell node, this injected charge will raise the voltage beyond the background voltage stored on the capacitor during the second phase, and if it exceeds the threshold voltage the comparator will go high to indicate a strike.

13. The detector circuit of claim 9, coupled to activate redundancy repair latches in a SRAM, wherein when the detector circuit detects an alpha particle or cosmic ray strike of the redundancy repair latches, a reload is issued of the repair data to the redundancy repair latches.

14. A method for detecting an alpha particle or cosmic ray strike in a silicon substrate having semiconductor circuits fabricated therein comprising:
connecting a detector circuit to the silicon substrate to provide a detectable digital signal when the silicon substrate receives an alpha particle or cosmic ray strike;
generating a timing signal specifying periods of non-active operation of the semiconductor circuits; and
activating the detector circuit by the timing signal only when the semiconductor circuits are non-active to eliminate false triggering from substrate currents flowing during normal switching operations of the semiconductor circuits.

15. The method of claim 14, including generating the timing signal from a clock signal for clocking and operating the semiconductor circuits fabricated in the silicon substrate.

16. The method of claim 14, for redundancy repair latches in a SRAM, wherein when the detector circuit detects an alpha particle or cosmic ray strike of the redundancy repair latches, including the step of issuing a reload of the repair data to the redundancy repair latches.

17. A method for detecting an alpha particle or cosmic ray strike of a first silicon well or a second silicon well by differentially detecting floating voltages of the first and second silicon wells during periods of non-operation of circuits fabricated in the first and second silicon wells by:
connecting a sense amp, including a latch circuit therein, to each of the first and second wells;
generating an early timing signal before a period of normal operation of the circuits defined in the first and second silicon wells, wherein the early timing signal turns on the sense amp and disconnects the sense amp from the first and second silicon wells, to capture the floating voltages of the first and second silicon wells in the sense amp at that point in time, and the sense amp amplifies and rectifies any voltage differential between the captured floating voltages of the first and second silicon wells.

18. The method of claim 17, for redundancy repair latches in a SRAM, wherein when the detector circuit detects an alpha particle or cosmic ray strike of the redundancy repair latches, including the step of issuing a reload of the repair data to the redundancy repair latches.

19. A method for detecting an alpha particle or cosmic ray strike of a first silicon well or a second well by differentially detecting floating voltages of the first and second silicon wells during periods of non-operation of circuits fabricated in the first and second silicon wells by:
connecting first and second sense amps, each including a latch circuit therein, to each of the first and second silicon wells;
generating an early timing signal before a period of normal operation of the circuits defined in the first and second silicon wells, wherein the early timing signal turns on the first and second sense amps and disconnects the first and second sense amps from the first and second silicon wells to capture the floating voltages of the first and second silicon wells in each of the first and second sense amps at that point in time, and each sense amp amplifies and rectifies any voltage differential between the captured floating voltages of the first and second silicon wells.

20. The method of claim 19, including designing the first and second sense amps with a built in asymmetry, to establish a preferential set of the latches in the first and second sense amps, such that for equal input floating voltages from the first and second wells, the asymmetry results in a first specified output condition, and if the first well incurred a strike, resulting in a slightly higher floating voltage in the first well than in the second well, then the first and second sense amps produce a second specified output condition indicating a strike in the first well, and if the second well incurred a strike, resulting in a slightly higher floating voltage in the second well than in the first well, then the first and second sense amps produce a third specified output condition indicating a strike in the second well.

21. The method of claim 19, for redundancy repair latches in a SRAM, wherein when the detector circuit detects an alpha particle or cosmic ray strike of the redundancy repair latches, including the step of issuing a reload of the repair data to the redundancy repair latches.

22. A method for monitoring a single silicon well in a silicon substrate for an alpha particle or cosmic ray strike by monitoring a background voltage level of the silicon well over consecutive periods of time, by comparing the silicon well voltage Vwell over a first sampling period of time with the silicon well voltage Vwell over a second sampling period of time to detect a deviation in the silicon well voltage which is indicative of a strike, to take a correlated double sampling of the background voltage level of the Vwell node voltage while allowing cancellation of base leakage current and noise current injection of the silicon well voltage Vwell.

23. The method of claim 22, for redundancy repair latches in a SRAM, wherein when the detector circuit detects an alpha particle or cosmic ray strike of the redundancy repair latches, including the step of issuing a reload of the repair data to the redundancy repair latches.

24. In an integrated circuit, a detector circuit for detecting alpha or cosmic ray strikes, the detector circuit comprising:
   a first area of the integrated circuit;
   a monitoring circuit for monitoring a flow of current in the first area and indicating when the current is outside of a predefined range.

* * * * *